(12) United States Patent
Pax

(10) Patent No.: US 7,547,213 B2
(45) Date of Patent: Jun. 16, 2009

(54) MEMORY MODULES AND METHODS FOR MANUFACTURING MEMORY MODULES

(75) Inventor: George E. Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 342 days.

(21) Appl. No.: 10/927,607

(22) Filed: Aug. 26, 2004

(65) Prior Publication Data

US 2006/0042821 A1     Mar. 2, 2006

(51) Int. Cl.
*H01R 13/60* (2006.01)

(52) U.S. Cl. ................ 439/60; 174/250; 439/924.1

(58) Field of Classification Search ............. 361/788, 361/777; 439/951, 60, 924.1, 55; 710/301; 174/250, 261, 788

See application file for complete search history.

(56) References Cited

U.S. PATENT DOCUMENTS

| | | | | |
|---|---|---|---|---|
| 5,470,240 A | * | 11/1995 | Suzuki | ............ 439/157 |
| 5,620,342 A | | 4/1997 | Kinross | |
| 5,692,910 A | | 12/1997 | Mittal | |
| 6,288,924 B1 | * | 9/2001 | Sugano et al. | ............ 365/52 |
| 6,326,699 B2 | * | 12/2001 | Shimizu et al. | ............ 257/786 |
| 6,347,394 B1 | * | 2/2002 | Ochoa et al. | ............ 716/6 |
| 7,027,307 B2 | * | 4/2006 | Kollipara et al. | ............ 361/760 |
| 7,034,544 B2 | * | 4/2006 | Ye et al. | ............ 324/534 |
| 7,102,221 B2 | * | 9/2006 | Miyamoto et al. | ............ 257/690 |

OTHER PUBLICATIONS

Office Action issued Dec. 12, 2008 in U.S. Appl. No. 11/614,213.

* cited by examiner

*Primary Examiner*—Jeremy C Norris
*Assistant Examiner*—Abiy Getachew
(74) *Attorney, Agent, or Firm*—Perkins Coie LLP

(57) ABSTRACT

Memory modules and methods for manufacturing memory modules are disclosed herein. In one embodiment, a memory module includes a substrate, a microelectronic device carried by the substrate, and a plurality of external contact pads operably coupled to the microelectronic device. The substrate includes a first major surface with a first longitudinal edge and a second longitudinal edge. The external contact pads are disposed on the first major surface proximate to the second longitudinal edge. The contact pads include a first contact pad with a first end proximate to the second longitudinal edge and a second contact pad with a second end proximate to the second longitudinal edge. The first end is spaced apart from the first longitudinal edge by a first distance, and the second end is spaced apart from the first longitudinal edge by a second distance different than the first distance.

58 Claims, 6 Drawing Sheets

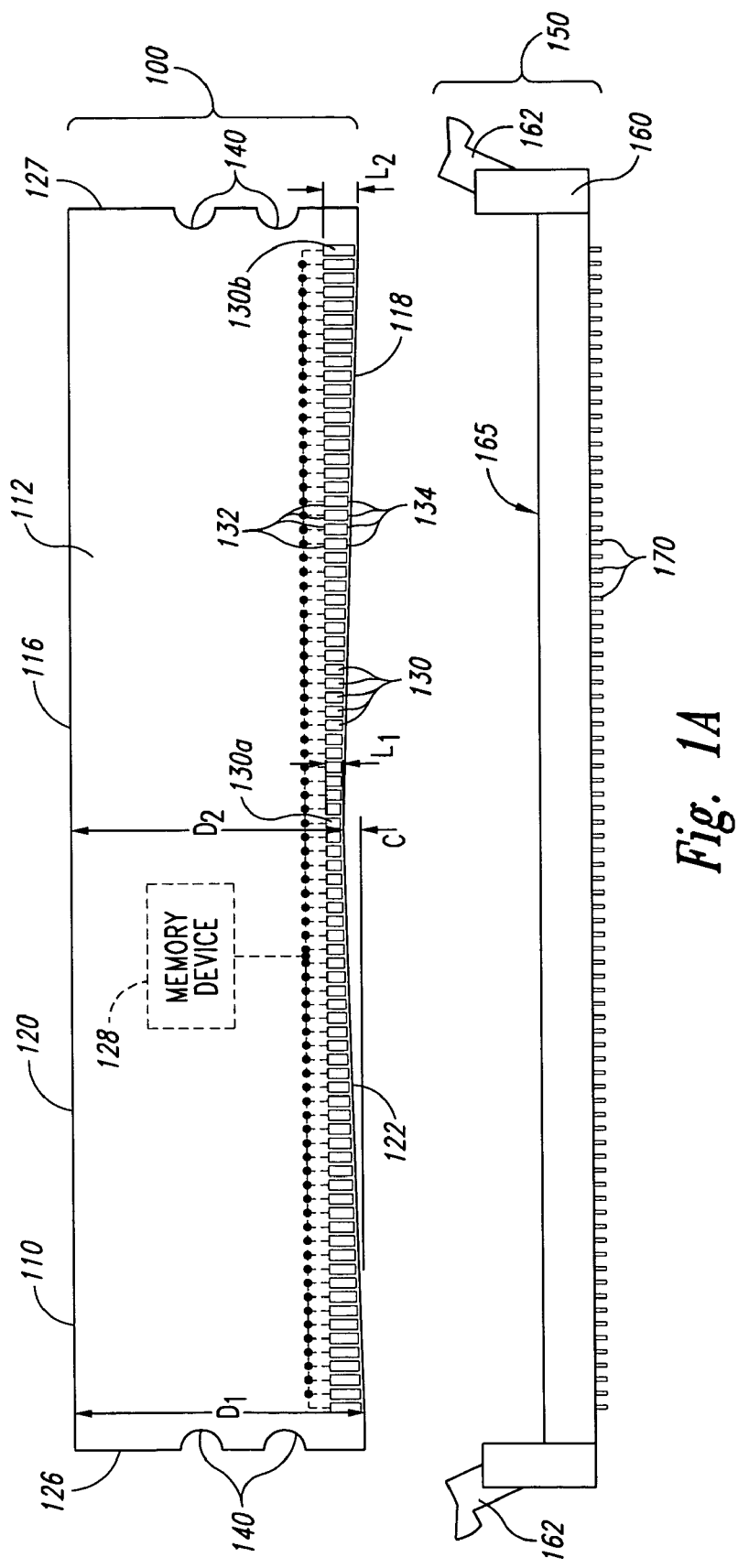

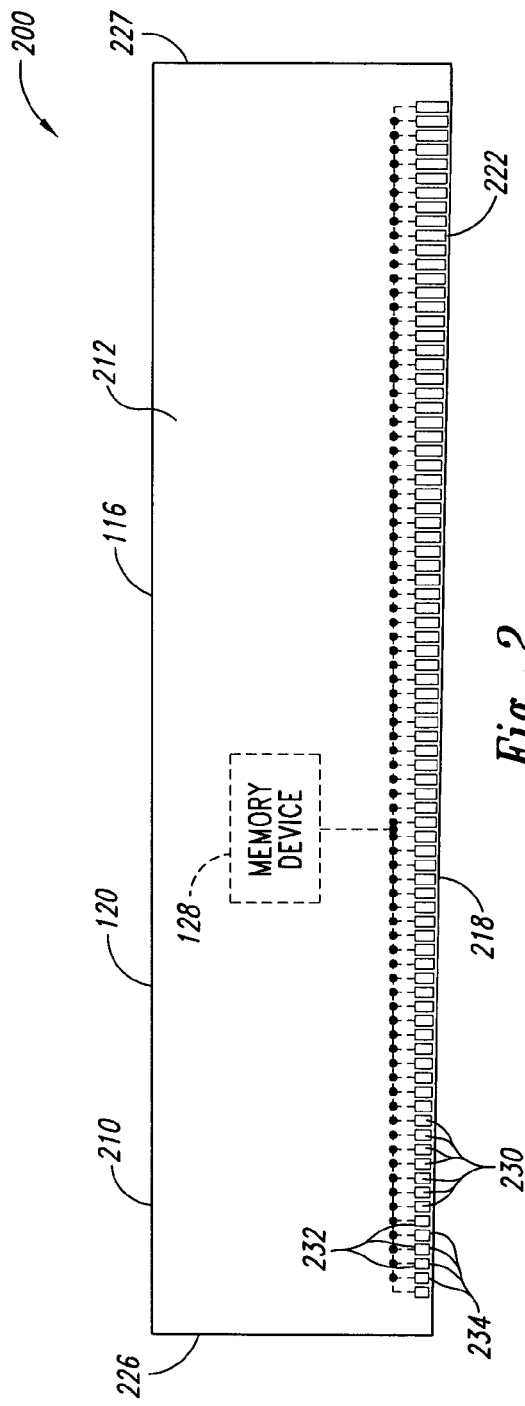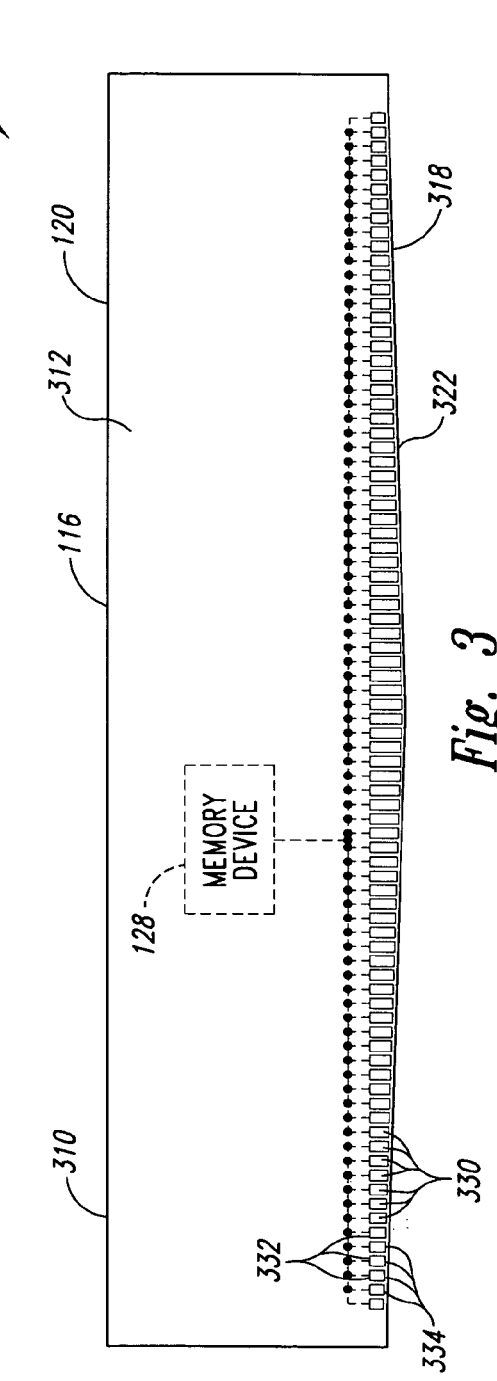

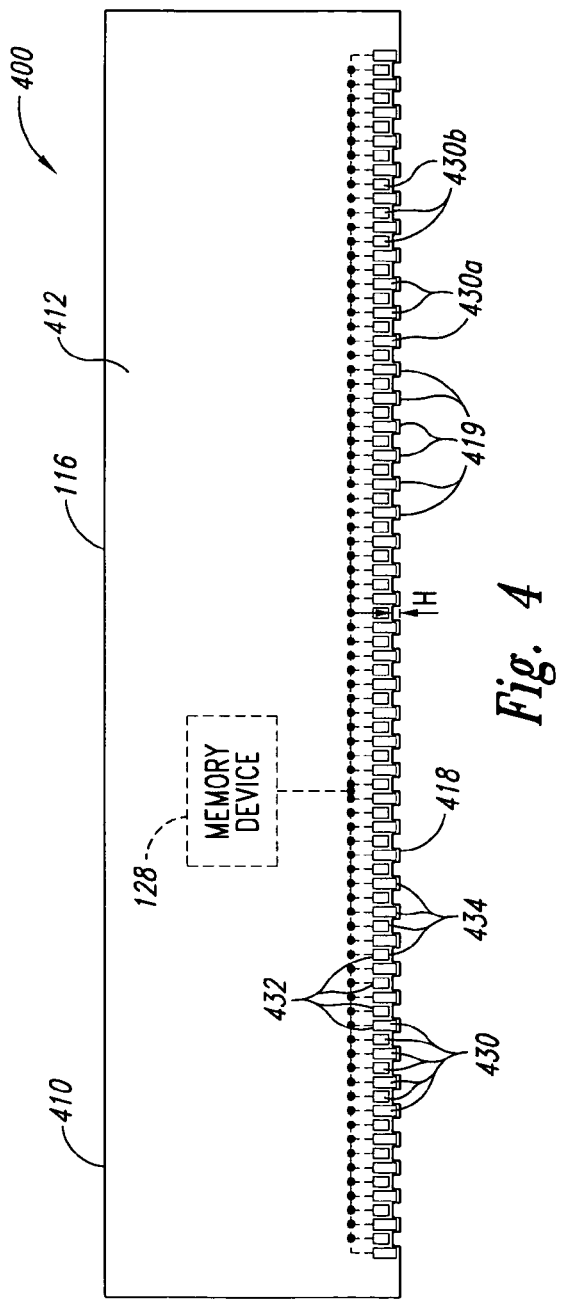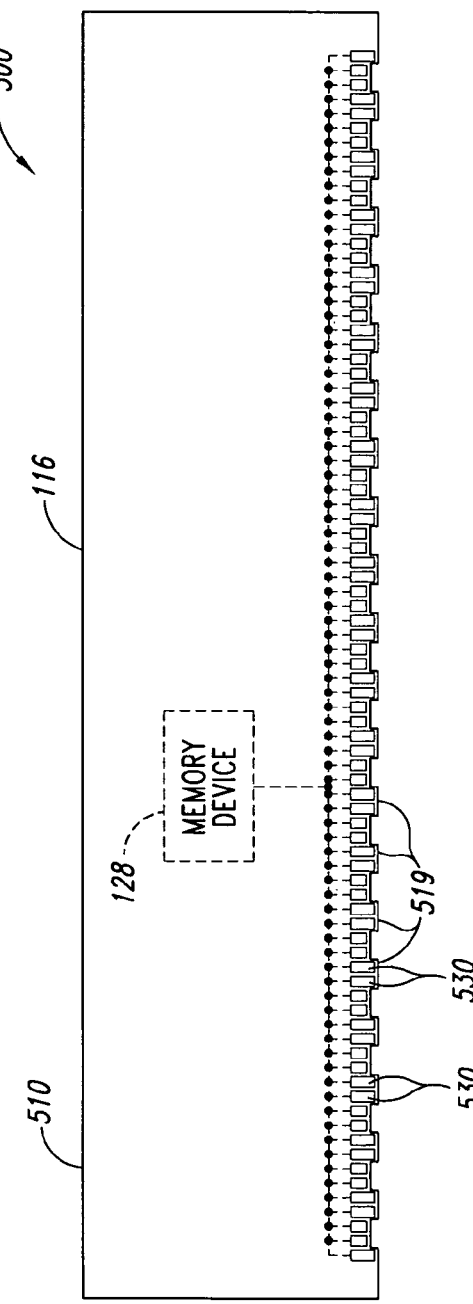

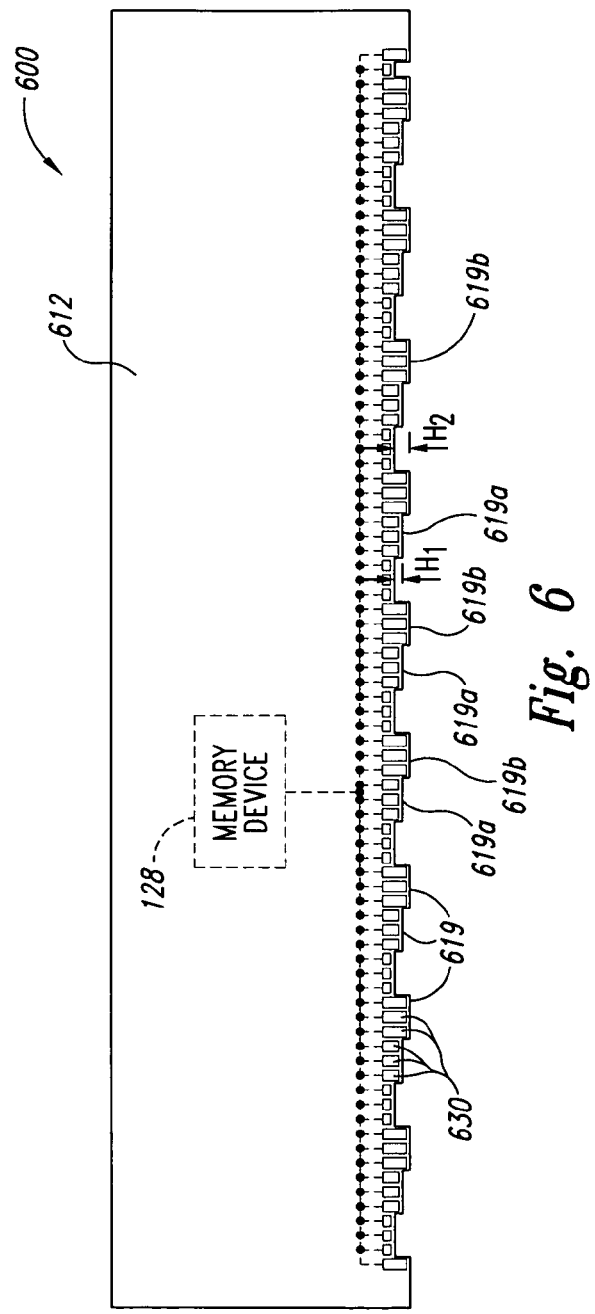
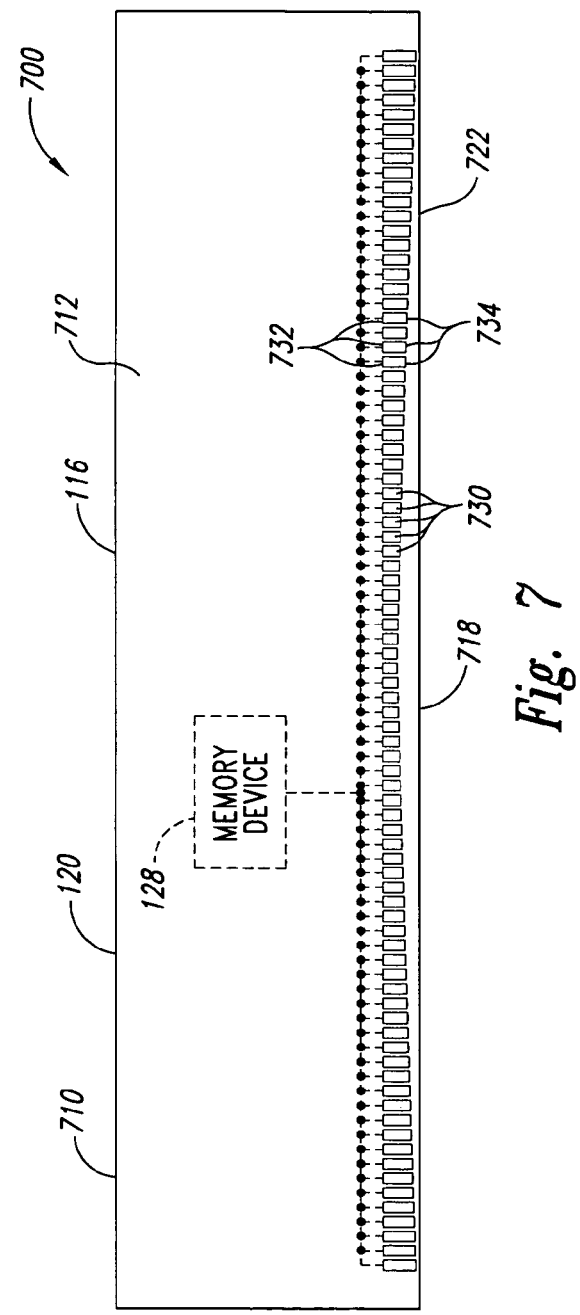

MEMORY MODULES AND METHODS FOR MANUFACTURING MEMORY MODULES

TECHNICAL FIELD

The present invention relates to memory modules and methods for manufacturing memory modules. More particularly, the invention is directed to memory modules for use with a connector having a socket.

BACKGROUND

Conventional microelectronic devices are manufactured for specific performance characteristics required for use in a wide range of electronic equipment. A packaged microelectronic device can include a die, an interposer substrate or lead frame attached to the die, and a molded casing around the die. The die generally has an integrated circuit and a plurality of bond-pads electrically connected to the integrated circuit. The bond-pads are coupled to terminals on the interposer substrate or lead frame. The interposer substrate can also include ball-pads connected to the terminals by conductive traces in a dielectric material. A plurality of solder balls can be attached to corresponding ball-pads to construct a "ball-grid" array.

Several dies can be attached to a single substrate to form a multi-chip module (MCM), such as a single in-line memory module (SIMM) or a dual in-line module (DIMM), for applications in which the performance requirements exceed the capability of a single die. A SIMM is a memory module having several dies aligned in a row and connected to a printed circuit board to, in effect, create a single device with the memory capacity of the combined dies. The internal circuitry of the printed circuit board connects each die to contact pads that are disposed on one side of the module proximate to the edge. The contact pads are arranged for attachment to an edge-type connector. A DIMM is similar to a SIMM, except the DIMM provides additional memory capacity and includes contact pads on both sides of the module proximate to the edge.

Edge-type connectors receive SIMMs, DIMMs, and other types of memory modules to electrically couple the modules to external devices. For example, a conventional connector for use with a DIMM includes a socket having a plurality of pins arranged in two rows to contact the pads on each side of the module, respectively. When the module is inserted into the socket, the pads on the module contact and flex corresponding pins as the pads slide along the pins to a contact point.

One drawback of conventional memory modules is that the force required for inserting the modules into the connectors can be large. This is particularly true for high performance memory modules that require connectors with high pin counts. In applications in which the memory modules are manually inserted into the connectors, an individual may bend the pins, break the connector, and/or damage the module due to the large insertion force. It is also possible that some individuals may not be able to apply sufficient force to reliably insert the modules. To reduce the insertion force, the individual may first insert one end of the module into the connector and then pivot the module downward to insert the other end into the connector. This approach, however, exerts side forces on the pins of the connector, which tends to bend the pins and damage the connector. Another approach to reduce the insertion force includes beveling the portion of the memory module between the contact pads and the edge. This approach, however, does not reduce the insertion force because the pins typically do not contact the beveled portion of the module. Accordingly, there is a need to reduce the force required for inserting memory modules into connectors.

BRIEF DESCRIPTION OF THE DRAWINGS

FIG. 1A is a schematic front view of a memory module and a connector in accordance with one embodiment of the invention.

FIG. 2 is a schematic front view of a memory module in accordance with another embodiment of the invention.

FIG. 3 is a schematic front view of a memory module in accordance with another embodiment of the invention.

FIG. 4 is a schematic front view of a memory module in accordance with another embodiment of the invention.

FIG. 5 is a schematic front view of a memory module in accordance with another embodiment of the invention.

FIG. 6 is a schematic front view of a memory module in accordance with another embodiment of the invention.

FIG. 7 is a schematic front view of a memory module in accordance with another embodiment of the invention.

DETAILED DESCRIPTION

A. Overview

Figure 1B:
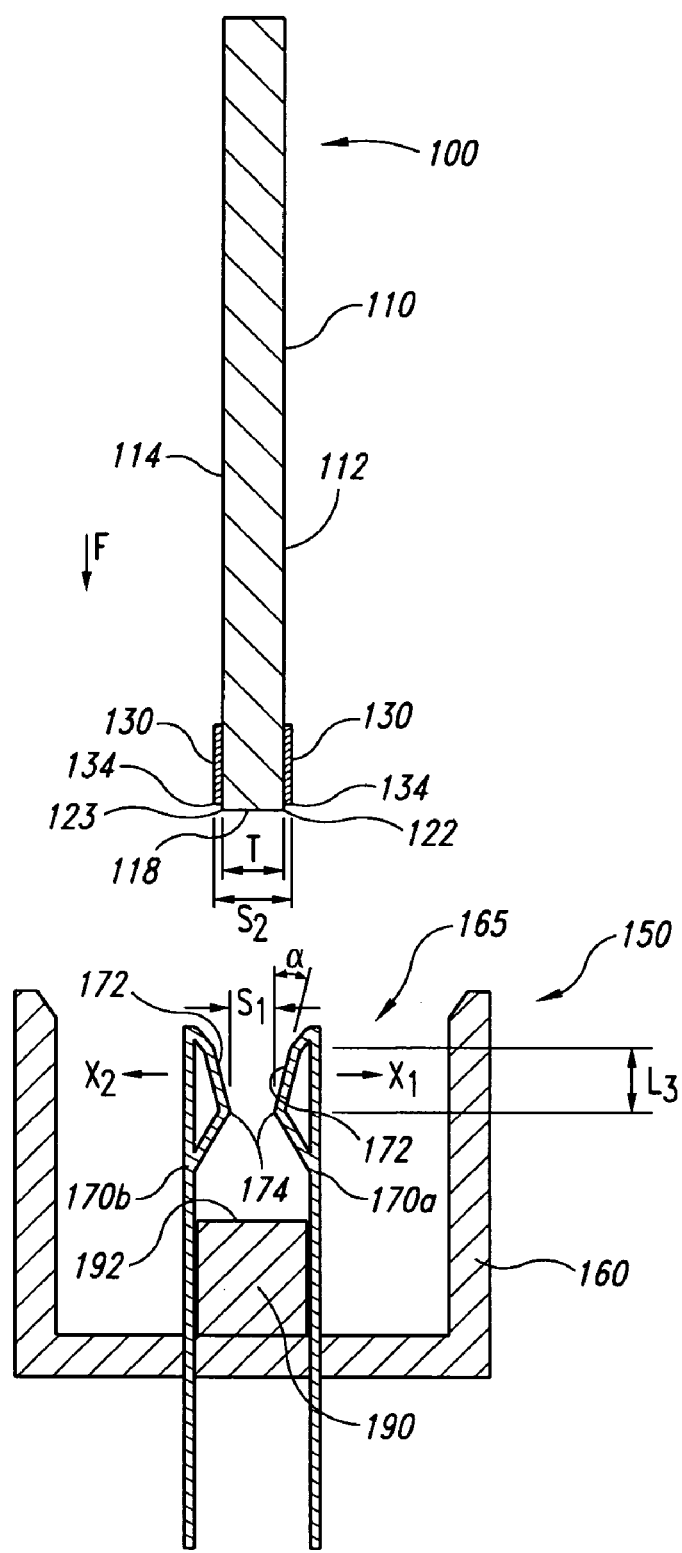
FIG. 1B is a schematic side cross-sectional view of the memory module and the connector of FIG. 1A.

The following disclosure describes several embodiments of memory modules and methods for manufacturing memory modules. One aspect of the invention is directed to memory modules for use with a connector having a socket. In one embodiment, a memory module includes a card, a microelectronic device carried by the card, and a plurality of external contact pads on the card that are operably coupled to the microelectronic device. The card includes a first major surface and a second major surface opposite the first major surface. The first major surface has a first longitudinal edge and a second longitudinal edge opposite the first longitudinal edge. The external contact pads are disposed on the first major surface of the card proximate to the second longitudinal edge. The contact pads include a first contact pad with a first end proximate to the second longitudinal edge and a second contact pad with a second end proximate to the second longitudinal edge. The first end is spaced apart from the first longitudinal edge by a first distance, and the second end is spaced apart from the first longitudinal edge by a second distance different than the first distance.

In another embodiment, a memory module includes a body, a memory device carried by the body, and a plurality of external contact pads on the body that are operably coupled to the memory device. The body includes a first surface, a second surface opposite the first surface, a first longitudinal side between the first and second surfaces, and a second longitudinal side between the first and second surfaces. The second longitudinal side is nonplanar and can include teeth or have a V-shaped or other configuration. The external contact pads are arranged on the first surface proximate to the second longitudinal side for electrical connection with corresponding pins when the module is received in a socket.

In another embodiment, a memory module includes a board having a first surface, a second surface opposite the first surface, a first longitudinal side between the first and second surfaces, and a second longitudinal side between the first and second surfaces. The first longitudinal side defines a first plane and the second longitudinal side defines a second plane nonparallel with the first plane. The module further includes a microelectronic device attached to the board, a first plurality of external contact pads positioned on the first surface, and a second plurality of external contact pads positioned on the second surface. The first and second pluralities of external contact pads electrically couple the microelectronic device to an external device when the board is received in a socket and the first and second external contact pads contact corresponding pins.

In another embodiment, a memory module includes a card having a surface, a microelectronic device carried by the card, and a plurality of external contact pads operably coupled to the microelectronic device. The external contact pads are arranged on the surface such that at least several of the contact pads contact corresponding pins of a socket at different times as the card is inserted into the socket to reduce the insertion force.

Another aspect of the invention is directed to methods for manufacturing a memory module for use with a connector having a socket. The method includes forming a plurality of first external contact pads on a first surface of a card and forming a plurality of second external contact pads on a second surface of the card. The plurality of first external contact pads include a first contact pad with a first length and a second contact pad with a second length different than the first length. The method can optionally include mounting a microelectronic device to the card so that contacts on the microelectronic device are attached to the first and second external contact pads.

The following disclosure is directed to memory modules and methods for manufacturing memory modules. The term "memory module" is used throughout to include microelectronic devices, data storage elements, and other articles of manufacture. For example, memory modules include SIMM, DIMM, DRAM, flash-memory, ASICS, processors, and other types of electronic devices or components. Several specific details of the invention are set forth in the following description and in FIGS. 1A-8 to provide a thorough understanding of certain embodiments of the invention. One skilled in the art, however, will understand that the present invention may have additional embodiments and that the embodiments of the invention may be practiced without several of the specific features described below.

B. Embodiments of Memory Modules for Use with Connectors

FIG. 1A is a schematic front view of a memory module 100 and a connector 150 in accordance with one embodiment of the invention. The connector 150 is configured for receiving the memory module 100 and electrically connecting the module 100 to an external device. The memory module 100 includes a substrate 110, a microelectronic device 128 (shown schematically in broken lines) attached to the substrate 110, and a plurality of external contact pads 130 on the substrate 110. The substrate 110 can be a card, board, or other structure to which one or more microelectronic devices 128 can be attached. The microelectronic device 128 can include one or more microelectronic dies, and the contact pads 130 are electrically connected to the microelectronic device 128 to provide external terminals for the device 128. The microelectronic device 128, for example, can be a memory device, a processor, or other type of device.

The illustrated substrate 110 includes a first surface 112, a second surface 114 (shown in FIG. 1B) opposite the first surface 112, a first longitudinal side 116 extending between the first and second surfaces 112 and 114, and a second longitudinal side 118 opposite the first longitudinal side 116 and extending between the first and second surfaces 112 and 114. The substrate 110 further includes a first longitudinal edge 120 at the interface of the first surface 112 and the first longitudinal side 116, a second longitudinal edge 122 at the interface of the first surface 112 and the second longitudinal side 118, a first transverse side 126 extending between the first and second surfaces 112 and 114, and a second transverse side 127 opposite the first transverse side 126 and extending between the first and second surfaces 112 and 114.

In the illustrated substrate 110, the first longitudinal side 116 is generally planar, and the second longitudinal side 118 is nonplanar and has an inverted V-shaped configuration. As such, a first distance $D_1$ between the first and second longitudinal edges 120 and 122 at an outboard portion of the first surface 112 is greater than a second distance $D_2$ between the first and second longitudinal edges 120 and 122 at an inboard portion of the first surface 112. The difference between the first distance $D_1$ and the second distance $D_2$ defines a depth C at the center of the second longitudinal side 118. In other embodiments, such as those described below with reference to FIGS. 2-8, the second longitudinal side 118 can have other configurations.

The external contact pads 130 are arranged in (a) a row on the first surface 112 proximate to the second longitudinal edge 122 and/or (b) a row on the second surface 114 (FIG. 1B) proximate to a third longitudinal edge 123 (FIG. 1B). The individual contact pads 130 have a first end 132, a second end 134 opposite the first end 132, and a length extending between the first and second ends 132 and 134. In the illustrated embodiment, the distance between the first longitudinal edge 120 and the first end 132 of the individual pads 130 generally is the same, and the distance between the first longitudinal edge 120 and the second end 134 of the individual pads 130 varies and depends on the length of the pad 130.

The illustrated contact pads 130 have different lengths corresponding to the position of the pad 130 on the first or second surface 112 and 114 and the contour of the second longitudinal side 118. For example, a first contact pad 130a at a center portion of the first surface 112 has a first length $L_1$, and a second contact pad 130b at an outer portion of the first surface 112 has a second length $L_2$ greater than the first length $L_1$. In the illustrated embodiment, the length of the individual contact pads 130 increases with the distance the pad 130 is spaced apart from the center of the first surface 112. In other embodiments, however, the individual pads may not have a greater length than an adjacent inboard pad. For example, a group of pads can have the same length, and the individual pads in a single group can have a greater length than the pads in an adjacent inboard group.

In one aspect of the illustrated embodiment, contact pads 130 with similar lengths may have similar functions. For example, the longer pads may carry the power and ground, and the shorter pads may carry the signals. Because the capacitance of the individual pads corresponds to the length of the pad, pads carrying high frequency signals may have shorter lengths to reduce the capacitance. Moreover, pads carrying signals with similar frequencies may have similar lengths and therefore comparable performance. In other applications, however, longer pads may carry high frequency signals.

FIG. 1B is a schematic side cross-sectional view of the memory module 100 and the connector 150 of FIG. 1A. Referring to both FIGS. 1A and 1B, the illustrated connector 150 includes a body 160, a socket 165 defined by the body 160, and a plurality of pins 170 attached to the body 160 for electrically coupling corresponding pads 130 of the module 100 to an external device. The socket 165 is sized to receive a portion of the memory module 100 proximate to the second longitudinal side 118. The pins 170 include a plurality of first pins 170a arranged in a row to contact corresponding pads 130 on the first surface 112 of the memory module 100 and a plurality of second pins 170b arranged in a row to contact corresponding pads 130 on the second surface 114 of the module 100. Although in the illustrated embodiment, the pads 130 on the second surface 114 (FIG. 1B) are aligned with and have a similar configuration as the pads 130 on the first surface 112, in other embodiments, the second surface 114 may not include pads 130 or the pads 130 on the second surface 114 can be aligned differently or have other configurations. In such embodiments, the connector 150 may not include the second pins 170b, or the second pins 170b can have a different configuration to be aligned with the pads 130 on the second surface 114.

In the illustrated embodiment, the connector 150 also includes two latches 162 (FIG. 1A) configured to selectively engage notches 140 (FIG. 1A) in the first and second transverse sides 126 and 127 (FIG. 1A) for securing the module 100 to the connector 150 when the module 100 is received in the socket 165. The connector 150 may also include a spacer 190 with a stop surface 192 between the first and second pins 170a-b to provide support to an inserted module 100. In additional embodiments, the module 100 may not include the notches 140, and/or the connector 150 may not include the latches 162 and/or the spacer 190.

Referring only to FIG. 1B, the individual pins 170 include a face 172 and a contact point 174 for contacting the corresponding pad 130 on the module 100. The contact points 174 on adjacent first and second pins 170 are spaced apart by a first distance $S_1$, and the external surfaces of corresponding contact pads 130 on the first and second surfaces 112 and 114 of the module 100 are spaced apart by a second distance $S_2$ greater than the first distance $S_1$ so that the contact points 174 contact corresponding pads 130 when the module 100 is received in the socket 165. Although the illustrated substrate 110 has a thickness T greater than the distance $S_1$ between adjacent contact points 174, in other embodiments, the substrate 110 can have a thickness less than or equal to the distance $S_1$ between adjacent contact points 174.

The memory module 100 is inserted into the connector 150 by positioning the second and third longitudinal edges 122 and 123 on the face 172 of the first and second pins 170a-b, respectively, and exerting a force in a direction F to slide the edges 122 and 123 and the contact pads 130 across the face 172 of the pins 170. Because the distance $S_2$ between contact pads 130 on the first and second surfaces 112 and 114 is greater than the distance $S_1$ between adjacent contact points 174, the first and second pins 170a-b flex outwardly away from the memory module 100 in directions $X_1$ and $X_2$, respectively, as the contact pads 130 and the edges 122 and 123 slide across the face 172 of the pins 170. The individual pins 170 continue to flex until the contact point 174 contacts the corresponding pad 130 on the module 100. The module 100 is properly positioned in the connector 150 when the contact points 174 contact corresponding pads 130 and/or the second longitudinal side 118 rests on the stop surface 192 of the spacer 190. The force required to flex the pins 170 and insert the memory module 100 into the connector 150 is affected by several parameters, including (a) an angle α of the face 172, (b) a vertical length $L_3$ of the face 172, (c) the difference between the distance $S_1$ separating adjacent contact points 174 and the thickness T of the substrate 110, (d) the difference between the distance $S_1$ separating adjacent contact points 174 and the distance $S_2$ separating the contact pads 130 on the first and second surfaces 112 and 114, (e) the position of the contact pads 130 on the first and second surfaces 112 and 114, and (f) the material(s) from which the pins 170 are formed.

One feature of the illustrated memory module 100 is that the individual contact pads 130 contact corresponding pins 170 at different times when the module 100 is inserted into the connector 150. An advantage of this feature is that the position of the contact pads 130 on the first and second surfaces 112 and 114 reduces the force required to insert the module 100 into the connector 150. Because (a) the second ends 134 of the pads 130 are spaced apart from the first longitudinal side 116 by different distances, and (b) the second longitudinal side 118 has a nonplanar configuration, the individual contact pads 130 and sections of the second and third longitudinal edges 122 and 123 contact the pins 170 at different times. The outboard contact pads 130 and the outboard sections of the second and third longitudinal edges 122 and 123 contact the face 172 of the corresponding pins 170 before the inboard contact pads 130 and the inboard section of the longitudinal edges 122 and 123. As such, the pins 170 corresponding to the outboard contact pads 130 flex and their respective contact points 174 contact the outboard contact pads 130 before the pins 170 corresponding to the inboard contact pads 130 begin to flex. By flexing only a portion of the pins 170 at any given time during the insertion process, the force required to insert the memory module 100 into the connector 150 is reduced. The reduced insertion force (a) decreases the likelihood that the module 100 and/or the connector 150 will be damaged during a manual insertion process, and (b) allows modules and connectors with higher pin counts to be used without increasing the insertion force.

Referring to FIGS. 1A and 1B, in one aspect of the illustrated memory module 100, the ratio of the depth C (FIG. 1A) at the center of the second longitudinal side 118 to the vertical length $L_3$ of the face 172 of the individual pins 170 is approximately 2:1. As such, the insertion force is reduced by approximately 50 percent because at any given time at most one half of the pins 170 are flexing. In other embodiments, the ratio of the depth C to the vertical length $L_3$ can be less than or greater than 2:1.

C. Additional Embodiments of Memory Modules

FIG. 2 is a schematic front view of a memory module 200 in accordance with another embodiment of the invention. The memory module 200 is generally similar to the memory module 100 described above with reference to FIGS. 1A and 1B. For example, the memory module 200 includes a substrate 210, a microelectronic device 128 (shown schematically in broken lines) attached to the substrate 210, and a plurality of contact pads 230 arranged on the substrate 210 and electrically coupled to the microelectronic device 128. The illustrated substrate 210 includes a first surface 212, a second surface (not shown) opposite the first surface 212, a first longitudinal side 116 connecting the first surface 212 to the second surface, and a second longitudinal side 218 opposite the first longitudinal surface 116 and connecting the first surface 212 to the second surface. The substrate 210 also includes a first longitudinal edge 120 at the interface of the first surface 112 and the first longitudinal side 116, a second longitudinal edge 222 at the interface of the first surface 212 and the second longitudinal side 218, a first transverse side 226, and a second transverse side 227 opposite the first transverse side 226. In the illustrated embodiment, the second longitudinal side 218 has a generally planar configuration and is oriented at an angle relative to the first longitudinal sides 116. As such, the distance between the first and second longitudinal sides 116 and 218 at the first transverse side 226 is less than the distance between the first and second longitudinal sides 116 and 218 at the second transverse side 227.

The contact pads 230 are arranged in a row on the first surface 212 proximate to the second longitudinal edge 222. The individual contact pads 230 include a first end 232, a second end 234 opposite the first end 232, and a length extending between the first and second ends 232 and 234. In the illustrated embodiment, the distance between the first longitudinal edge 120 and the first end 232 of the individual contact pads 230 is approximately the same, and the distance between the first longitudinal edge 120 and the second end 234 of the individual contact pads 230 varies and depends on the length of the pad 230. The individual contact pads 230 have different lengths corresponding to the position of the pad 230 on the first surface 212 and the contour of the second longitudinal side 218. For example, the contact pads 230 proximate to the first transverse side 226 have a shorter length than the contact pads 230 proximate to the second transverse side 227. As such, the contact pads 230 of the illustrated module 200 contact the face 172 (FIG. 1B) of corresponding pins 170 (FIG. 1B) at different times during the insertion process and reduce the required insertion force. In other embodiments, the second surface of the module 200 may also include contact pads 230.

FIG. 3 is a schematic front view of a memory module 300 in accordance with another embodiment of the invention. The memory module 300 is generally similar to the memory module 100 described above with reference to FIGS. 1A and 1B. For example, the memory module 300 includes a substrate 310, a microelectronic device 128 (shown schematically in broken lines) attached to the substrate 310, and a plurality of contact pads 330 arranged on the substrate 310 and electrically coupled to the microelectronic device 128. The illustrated substrate 310 includes a first surface 312, a second surface (not shown) opposite the first surface 312, a first longitudinal side 116, a second longitudinal side 318 opposite the first longitudinal side 116, a first longitudinal edge 120, and a second longitudinal edge 322 opposite the first longitudinal edge 120; In the illustrated embodiment, the second longitudinal side 318 is nonplanar and has a V-shaped configuration. As such, the distance between the first and second longitudinal edges 120 and 322 at an inboard portion of the first surface 312 is greater than the distance between the first and second longitudinal edges 120 and 322 at an outboard portion of the first surface 312.

The contact pads 330 are arranged in a row on the first surface 312 proximate to the second longitudinal edge 322. The individual contact pads 330 include a first end 332 and a second end 334 opposite the first end 332. The distance between the first longitudinal edge 120 and the first end 332 of the individual pads 330 is approximately the same, and the distance between the first longitudinal edge 120 and the second end 334 of the individual pads 330 varies and depends on the length of the pad 330. The individual contact pads 330 have different lengths corresponding to the position of the pads 330 on the first surface 312 such that the longest pads 330 are located at an inboard section of the first surface 312 and the shortest pads 330 are positioned at an outboard section of the first surface 312. The configuration of contact pads 330 on the memory module 300 reduces the force required to insert the module 300 into the connector 150 (FIG. 1B) because the inboard pads 330 contact and flex corresponding pins 170 (FIG. 1B) before the outboard pads 330. In other embodiments, the individual contact pads 330 can have generally the same length, and the first end 332 of the individual pads 330 can be spaced apart from the first longitudinal edge 120 by different distances so that less than all of the pads 330 contact corresponding pins 170 at the same time during insertion.

One feature of the memory module 300 illustrated in FIG. 3 is that the longer contact pads 330 are located at an inboard section of the first surface 312. Because the center portion of the connector 150 (FIG. 1A) typically flexes away from the module 300 when the module 300 is inserted, the longer center pads 330 ensure that the pins 170 (FIG. 1A) contact corresponding pads 330 even if the connector 150 flexes.

FIG. 4 is a schematic front view of a memory module 400 in accordance with another embodiment of the invention. The memory module 400 is generally similar to the memory module 100 described above with reference to FIGS. 1A and 1B. For example, the memory module 400 includes a substrate 410, a microelectronic device 128 (shown schematically in broken lines) attached to the substrate 410, and a plurality of contact pads 430 arranged on the substrate 410. The illustrated substrate 410 includes a first surface 412, a second surface (not shown) opposite the first surface 412, a first longitudinal side 116, and a second longitudinal side 418 opposite the first longitudinal side 116. In the illustrated embodiment, the second longitudinal side 418 is nonplanar and includes a plurality of teeth 419. In other embodiments, the second longitudinal side 418 can include a different number of teeth. For example, the second longitudinal side 418 can include a single tooth at an inboard portion of the module 400 or two teeth at outboard portions of the module 400.

The contact pads 430 include a plurality of first pads 430a arranged on the first surface 412 and partially disposed on the teeth 419 and a plurality of second pads 430b arranged on the first surface 412 between adjacent first pads 430a. The individual contact pads 430 include a first end 432 and a second end 434 opposite the first end 432, and the second end 434 of the first pads 430a are disposed on corresponding teeth 419. As such, the second end 434 of the first pads 430a are spaced apart from the first longitudinal side 116 a greater distance than the second end 434 of the second pads 430b. In the illustrated memory module 400, a single contact pad 430 is disposed on each of the teeth 419, and the teeth 419 have a generally uniform height H. Other embodiments, however, may have other configurations. For example, FIG. 5 is a schematic front view of a memory module 500 having a substrate 510 with a plurality of teeth 519 and a plurality of contact pads 530 partially disposed on each of the individual teeth 519. Moreover, FIG. 6 is a schematic front view of a memory module 600 including a substrate 610 having a plurality of the teeth 619 with various heights and a plurality of contact pads 630 partially disposed on the individual teeth 619. The teeth 619 include first teeth 619a having a first height $H_1$ and second teeth 619b having a second height $H_2$ greater than the first height $H_1$. The memory module 600 also includes contact pads 630 between the groups of pads 630 on the individual teeth 619. In any of the modules 400, 500, and 600 described above with reference to FIGS. 4-6, the teeth can be sized so that the contact pads on the teeth flex the corresponding pins 170 (FIG. 1B) on the connector 150 (FIG. 1B) before the other pads on the module contact and flex the other pins 170 to reduce the force required to insert the module into the connector 150.

One feature of the memory modules 400, 500 and 600 illustrated in FIGS. 4-6 is that the second longitudinal sides include generally flat teeth that partially carry contact pads. An advantage of this feature is that the memory modules do not exert side forces on the pins 170 (FIG. 1B) when the modules are inserted into the connector 150 (FIG. 1B). More specifically, although the teeth flex the pins 170 outwardly away from the module, the teeth do not exert a side force that causes the pins 170 to flex toward an adjacent pin 170. Side forces can bend the pins 170 and damage the connector 150.

FIG. 7 is a schematic front view of a memory module 700 in accordance with another embodiment of the invention. The memory module 700 is generally similar to the memory module 100 described above with reference to FIGS. 1A and 1B. For example, the memory module 700 includes a substrate 710, a microelectronic device 128 (shown schematically in broken lines) attached to the substrate 710, and a plurality contact pads 730 arranged on the substrate 710. The illustrated substrate 710 includes a first surface 712, a second surface (not shown) opposite the first surface 712, a first longitudinal side 116, a second longitudinal side 718 opposite the first longitudinal side 116, a first longitudinal edge 120, and a second longitudinal edge 722 opposite the first longitudinal edge 120. In the illustrated embodiment, the second longitudinal side 718 is generally planar and oriented parallel to the first longitudinal side 116.

The contact pads 730 are arranged in a row on the first surface 712 proximate to the second longitudinal edge 722. The individual contact pads 730 have a first end 732, a second end 734 opposite the first end 732, and a length between the first and second ends 732 and 734. In the illustrated embodiment, the distance between the first longitudinal edge 120 and the first end 732 of the individual contact pads 730 is generally the same, and the distance between the first longitudinal edge 120 and the second end 734 of the individual contact pads 730 varies and depends on the length of the contact pads 730. The individual contact pads 730 have different lengths corresponding to the position of the pad 730 on the first surface 712. For example, the contact pads 730 positioned on an inboard portion of the first surface 712 have shorter lengths than the contact pads 730 positioned on an outboard portion of the first surface 712. As such, the distance between the second end 734 of the individual contact pads 730 and the second longitudinal edge 722 at an inboard section of the first surface 712 is greater than the distance between the second end 734 of the individual contact pads 730 and the second longitudinal edge 722 at an outboard section of the first surface 712. Accordingly, the contact pads 730 contact the face 172 (FIG. 1B) of corresponding contact pins 170 (FIG. 1B) at different times to reduce the force required for inserting the memory module 700 into the connector 150 (FIG. 1B).

Figure 8:
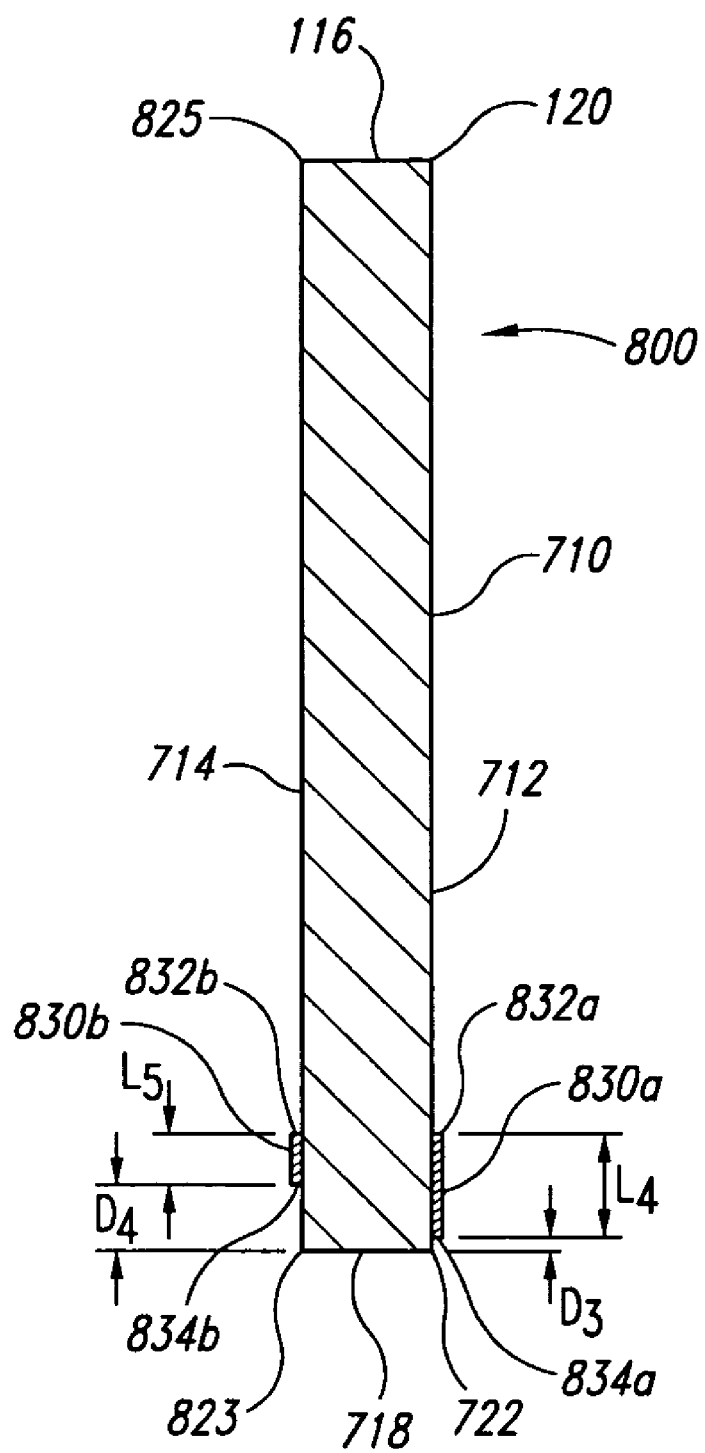
FIG. 8 is a schematic side cross-sectional view of a memory module in accordance with another embodiment of the invention.

FIG. 8 is a schematic side cross-sectional view of a memory module 800 in accordance with another embodiment of the invention; The memory module 800 is generally similar to the memory module 700 described above with reference FIG. 7. For example, the memory module 800 includes a substrate 810, a microelectronic device (not shown) carried by the substrate 810, and a plurality of contact pads 830 on the substrate 810. The illustrated substrate 810 includes a first surface 712, a second surface 714 opposite the first surface 712, a first longitudinal side 116, and a second longitudinal side 718 opposite the first longitudinal side 116. The substrate 810 further includes first and second longitudinal edges 120 and 722 on the first surface 712, and third and fourth longitudinal edges 823 and 825 on the second surface 714.

The contact pads 830 include a plurality of first pads 830*a* on the first surface 712 and a plurality of second pads 830*b* on the second surface 714. The individual pads 830 have a first end 832 and a second end 834 opposite the first end 832. The first pads 830*a* have a first length $L_4$, and the second end 834*a* of the individual first pads 830*a* is spaced apart from the second longitudinal edge 722 a first distance $D_3$. The second pads 830b have a second length $L_5$ less than the first length $L_4$, and the second end 834*b* of the individual second pads 830*b* is spaced apart from the third longitudinal edge 823 a second distance $D_4$ greater than the first distance $D_3$. The difference between the first distance $D_3$ and the second difference $D_4$ reduces the force required to insert the memory module 800 into the connector 150 (FIG. 1B) because the first pads 830*a* contact and flex corresponding first pins 170*a* (FIG. 1B) before the second pads 830*b* contact and flex corresponding second pins 170*b* (FIG. 1B) when the memory module 800 is inserted into the connector 150.

From the foregoing, it will be appreciated that specific embodiments of the invention have been described herein for purposes of illustration, but that various modifications may be made without deviating from the spirit and scope of the invention. For example, the features of any one of the memory modules described above can be combined with at least some of the features of another module described above. Accordingly, the invention is not limited except as by the appended claims.

I claim:

1. A memory module for use with a connector having a socket, the memory module comprising:
    a substrate including a first major surface and a second major surface opposite the first major surface, the first major surface having a first longitudinal edge and a second longitudinal edge opposite the first longitudinal edge;
    a microelectronic device carried by the substrate; and
    a plurality of external contact pads operably coupled to the microelectronic device and disposed on the first major surface of the substrate proximate to the second longitudinal edge, the external contact pads including a first contact pad with a first end proximate to the second longitudinal edge and a second contact pad with a second end proximate to the second longitudinal edge, wherein the first end is spaced apart from the first longitudinal edge by a first distance and the second end is spaced apart from the first longitudinal edge by a second distance different than the first distance.

2. The memory module of claim 1 wherein the substrate further comprises a card having a first longitudinal side proximate to the first longitudinal edge and a second longitudinal side proximate to the second longitudinal edge, and wherein the first longitudinal side defines a first plane and the second longitudinal side defines a second plane nonparallel with the first plane.

3. The memory module of claim 1 wherein the substrate further comprises a card having a first longitudinal side proximate to the first longitudinal edge and a second longitudinal side proximate to the second longitudinal edge, and wherein the first longitudinal side defines a first plane and the second longitudinal side defines a second plane parallel to the first plane.

4. The memory module of claim 1 wherein the substrate further comprises a printed circuit board having a first longitudinal side proximate to the first longitudinal edge and a second longitudinal side proximate to the second longitudinal edge, and wherein the second longitudinal side is nonplanar.

5. The memory module of claim 1 wherein the first contact pad has a first length and the second contact pad has a second length different than the first length.

6. The memory module of claim 1 wherein:
    the plurality of external contact pads is a first plurality of external contact pads; and the module further comprises a second plurality of external contact pads operably coupled to the microelectronic device and disposed on the second major surface.

7. The memory module of claim 1 wherein:
the substrate further comprises a card having a first longitudinal side and a second longitudinal side opposite the first longitudinal side, the first longitudinal side having the first longitudinal edge and a third longitudinal edge opposite the first longitudinal edge, the second longitudinal side having the second longitudinal edge and a fourth longitudinal edge opposite the second longitudinal edge;
the plurality of external contact pads is a first plurality of external contact pads;
the module further comprises a second plurality of external contact pads operably coupled to the microelectronic device and disposed on the second major surface proximate the fourth longitudinal edge;
the individual pads in the first plurality of external contact pads have corresponding pads in the second plurality of external contact pads that are positioned to contact adjacent pins in the socket; and
at least one of the first plurality of external contact pads is spaced apart from the second longitudinal edge by a third distance and the corresponding contact pad in the second plurality of external contact pads is spaced apart from the fourth longitudinal edge by a fourth distance different than the third distance.

8. The memory module of claim 1 wherein the first end is spaced apart from the second longitudinal edge by a third distance and the second end is spaced apart from the second longitudinal edge by a fourth distance different than the third distance.

9. The memory module of claim 1 wherein the first end is spaced apart from the second longitudinal edge by a third distance and the second end is spaced apart from the second longitudinal edge by a fourth distance at least approximately equal to the third distance.

10. The memory module of claim 1 wherein the first major surface includes an inboard section and an outboard section, wherein the first longitudinal edge is spaced apart from the second longitudinal edge by a third distance across the inboard section and the first longitudinal edge is spaced apart from the second longitudinal edge by a fourth distance across the outboard section, and wherein the fourth distance is greater than the third distance.

11. The memory module of claim 1 wherein the first major surface includes an inboard section and an outboard section, wherein the first longitudinal edge is spaced apart from the second longitudinal edge by a third distance across the inboard section and the first longitudinal edge is spaced apart from the second longitudinal edge by a fourth distance across the outboard section, and wherein the fourth distance is less than the third distance.

12. The memory module of claim 1 wherein the substrate further comprises a first transverse side and a second transverse side opposite the first transverse side, the first and second transverse sides being oriented generally normal to the first longitudinal edge, wherein the first longitudinal edge is spaced apart from the second longitudinal edge by a third distance at the first transverse side and the first longitudinal edge is spaced apart from the second longitudinal edge by a fourth distance at the second transverse side, and wherein the fourth distance is different than the third distance.

13. The memory module of claim 1 wherein:
the substrate further comprises a plurality of spaced-apart teeth; and
the external contact pads include a plurality of first contact pads partially on corresponding teeth and a plurality of second contact pads between adjacent first contact pads.

14. The memory module of claim 1 wherein:
the substrate further comprises a plurality of spaced-apart teeth; and
the external contact pads include a plurality of first contact pads partially on the teeth and a plurality of second contact pads between the first contact pads on adjacent teeth, the individual teeth carrying at least two first contact pads.

15. The memory module of claim 1 wherein:
the substrate further comprises a plurality of first teeth having a first height and a plurality of second teeth having a second height different than the first height; and
the external contact pads include a plurality of first contact pads partially on corresponding first teeth, a plurality of second contact pads partially on corresponding second teeth, and a plurality of third contact pads between the first and/or second contact pads on adjacent first and/or second teeth.

16. The memory module of claim 1 wherein the second longitudinal edge has a "V" shaped configuration.

17. The memory module of claim 1 wherein the length of the individual external contact pads corresponds to the signals transmitted through the respective contact pads.

18. A memory module for use in a connector having a socket and a plurality of pins, the memory module comprising:
a body including a first surface, a second surface opposite the first surface, a first longitudinal side between the first and second surfaces, and a second longitudinal side between the first and second surfaces and opposite the first longitudinal side, wherein the second longitudinal side is generally continuous and nonplanar;
a memory device mounted to the body; and
a plurality of external contact pads operably coupled to the memory device, the external contact pads being arranged on the first surface proximate to the second longitudinal side for electrical connection with corresponding pins when the module is received in the socket.

19. The memory module of claim 18 wherein:
the body further comprises a card having a first longitudinal edge at the interface of the first surface and the first longitudinal side and a second longitudinal edge at the interface of the first surface and the second longitudinal side;
the external contact pads comprise a first contact pad with a first end proximate to the second longitudinal edge and a second contact pad with a second end proximate to the second longitudinal edge; and
the first end is spaced apart from the first longitudinal edge by a first distance and the second end is spaced apart from the first longitudinal edge by a second distance different than the first distance.

20. The memory module of claim 18 wherein the external contact pads comprise a first contact pad with a first length and a second contact pad with a second length different than the first length.

21. The memory module of claim 18 wherein:
the plurality of external contact pads is a first plurality of external contact pads; and
the module further comprises a second plurality of external contact pads operably coupled to the memory device and disposed on the second surface proximate to the second longitudinal side.

22. The memory module of claim 18 wherein:
the body further comprises a card having a first longitudinal edge at the interface of the first surface and the first longitudinal side and a second longitudinal edge at the interface of the first surface and the second longitudinal side;
the first surface has an inboard section and an outboard section; and
the first longitudinal edge is spaced apart from the second longitudinal edge by a third distance across the inboard section and the first longitudinal edge is spaced apart from the second longitudinal edge by a fourth distance across the outboard section, the fourth distance being different than the third distance.

23. The memory module of claim 18 wherein:
the body further comprises a card having a first longitudinal edge at the interface of the first surface and the first longitudinal side, a second longitudinal edge at the interface of the first surface and the second longitudinal side, a first transverse side, and a second transverse side opposite the first transverse side, the first and second transverse sides being oriented generally normal to the first longitudinal side; and
the first longitudinal edge is spaced apart from the second longitudinal edge by a third distance at the first transverse side and the first longitudinal edge is spaced apart from the second longitudinal edge by a fourth distance at the second transverse side, the fourth distance being different than the third distance.

24. The memory module of claim 18 wherein:
the body further comprises a plurality of spaced-apart teeth; and
the external contact pads include a plurality of first contact pads partially on the teeth and a plurality of second contact pads between the first contact pads on adjacent teeth.

25. A memory module for use in a connector having a socket and a plurality of pins, the memory module comprising:
a substrate including a first surface, a second surface opposite the first surface, a first longitudinal side between the first and second surfaces, and a second longitudinal side between the first and second surfaces and opposite the first longitudinal side, the first longitudinal side defining a first plane and the second longitudinal side defining a second plane nonparallel with the first plane;
a microelectronic device carried by the substrate;
a first plurality of external contact pads positioned on the first surface; and
a second plurality of external contact pads positioned on the second surface, the first and second external contact pads electrically coupling the microelectronic device to an external device when the module is received in the socket and the first and second pluralities of external contact pads contact corresponding pins.

26. The memory module of claim 25 wherein the first plurality of external contact pads comprise a first pad with a first length and a second pad with a second length different than the first length.

27. The memory module of claim 25 wherein the first plurality of external contact pads comprise a first pad with a first length and a second pad with a second length at least approximately the same as the first length.

28. The memory module of claim 25 wherein the first plurality of external contact pads comprise a first pad with a first length and the second plurality of external contact pads comprise a second pad with a second length different than the first length.

29. The memory module of claim 25 wherein:
the substrate further comprises a first longitudinal edge at the interface of the first surface and the second longitudinal side and a second longitudinal edge at the interface of the second surface and the second longitudinal side;
the first plurality of external contact pads comprise a first pad with a first end proximate to the first longitudinal edge, the first end being spaced apart from the first longitudinal edge by a first distance; and
the second plurality of external contact pads comprise a second pad with a second end proximate to the second longitudinal edge, the second end being spaced apart from the second longitudinal edge by a second distance different than the first distance.

30. The memory module of claim 25 wherein:
the substrate further comprises a first longitudinal edge at the interface of the first surface and the first longitudinal side and a second longitudinal edge at the interface of the first surface and the second longitudinal side;
the first plurality of external contact pads comprise a first pad with a first end proximate to the second longitudinal edge and a second pad with a second end proximate to the second longitudinal edge; and
the first end is spaced apart from the first longitudinal edge by a first distance and the second end is spaced apart from the first longitudinal edge by a second distance different than the first distance.

31. A memory module for use with a connector having a socket, the memory module comprising:
a substrate including a surface;
a microelectronic device carried by the substrate; and
a plurality of external contact pads operably coupled to the microelectronic device, the external contact pads being arranged on the surface such that at least several of the contact pads engage corresponding pins of the socket at different times as the module is inserted generally perpendicularly into the socket to reduce the insertion force.

32. The memory module of claim 31 wherein:
the surface is a first surface;
the substrate further comprises a second surface opposite the first surface, a first longitudinal side between the first and second surfaces, and a second longitudinal side between the first and second surfaces and opposite the first longitudinal side; and
the first longitudinal side defines a first plane and the second longitudinal side defines a second plane nonparallel with the first plane.

33. The memory module of claim 31 wherein:
the surface is a first surface;
the substrate further comprises a second surface opposite the first surface, a first longitudinal side between the first and second surfaces, and a second longitudinal side between the first and second surfaces and opposite the first longitudinal side; and
the second longitudinal side is nonplanar.

34. The memory module of claim 31 wherein the external contact pads comprise a first contact pad with a first length and a second contact pad with a second length different than the first length.

35. The memory module of claim 31 wherein:
the surface is a first surface and the plurality of external contact pads is a first plurality of contact pads;
the substrate further comprises a second surface opposite the first surface; and the module further comprises a second plurality of external contact pads operably coupled to the microelectronic device and disposed on the second surface.

36. The memory module of claim 31 wherein:
the surface is a first surface;
the first surface comprises a first longitudinal edge and a second longitudinal edge opposite the first longitudinal edge;
the external contact pads comprise a first contact pad with a first end proximate to the second longitudinal edge and a second contact pad with a second end proximate to the second longitudinal edge; and
the first end is spaced apart from the first longitudinal edge by a first distance and the second end is spaced apart from the first longitudinal edge by a second distance different than the first distance.

37. The memory module of claim 31 wherein:
the surface is a first surface;
the first surface comprises a first longitudinal edge and a second longitudinal edge opposite the first longitudinal edge;
the external contact pads comprise a first contact pad with a first end proximate to the second longitudinal edge and a second contact pad with a second end proximate to the second longitudinal edge; and
the first end is spaced apart from the first longitudinal edge by a first distance and the second end is spaced apart from the first longitudinal edge by a second distance at least approximately the same as the first distance.

38. The memory module of claim 31 wherein:
the substrate further comprises a plurality of spaced-apart teeth; and
the external contact pads comprise a plurality of first contact pads partially on the teeth and a plurality of second contact pads between the first contact pads on adjacent teeth.

39. A memory module for use with a connector having a socket, the memory module comprising:
a substrate including a first surface and a second surface opposite the first surface;
a microelectronic device carried by the substrate;
a first plurality of external contact pads arranged on the first surface, the first plurality of external contact pads including a first pad with a first length and a second pad with a second length different than the first length; and
a second plurality of external contact pads positioned on the second surface, the first and second pluralities of external contact pads being electrically coupled to the microelectronic device and positioned to contact corresponding pins when the module is received in the socket.

40. The memory module of claim 39 wherein:
the substrate further comprises a first longitudinal side between the first and second surfaces, and a second longitudinal side opposite the first longitudinal side and between the first and second surfaces; and
the first longitudinal side defines a first plane and the second longitudinal side defines a second plane nonparallel with the first plane.

41. The memory module of claim 39 wherein:
the substrate further comprises a first longitudinal side between the first and second surfaces, and a second longitudinal side opposite the first longitudinal side and between the first and second surfaces; and
the first longitudinal side defines a first plane and the second longitudinal side defines a second plane generally parallel to the first plane.

42. The memory module of claim 39 wherein:
the substrate further comprises a first longitudinal side between the first and second surfaces, a second longitudinal side opposite the first longitudinal side and between the first and second surfaces, a first longitudinal edge at the interface of the first surface and the first longitudinal side, and a second longitudinal edge at the interface of the first surface and the second longitudinal side;
the first pad has a first end proximate to the second longitudinal edge and the second pad has a second end proximate to the second longitudinal edge; and
the first end is spaced apart from the first longitudinal edge by a first distance and the second end is spaced apart from the first longitudinal edge by a second distance different than the first distance.

43. The memory module of claim 39 wherein:
the substrate further comprises a first longitudinal side between the first and second surfaces, a second longitudinal side opposite the first longitudinal side and between the first and second surfaces, a first longitudinal edge at the interface of the first surface and the first longitudinal side, and a second longitudinal edge at the interface of the first surface and the second longitudinal side;
the first pad has a first end proximate to the second longitudinal edge and the second pad has a second end proximate to the second longitudinal edge; and
the first end is spaced apart from the second longitudinal edge by a first distance and the second end is spaced apart from the second longitudinal edge by a second distance different than the first distance.

44. The memory module of claim 39 wherein:
the substrate further comprises a first longitudinal side between the first and second surfaces, and a second longitudinal side opposite the first longitudinal side and between the first and second surfaces; and
the second longitudinal side is nonplanar.

45. The memory module of claim 39 wherein the substrate further comprises a plurality of spaced-apart teeth partially carrying at least some of the first and second pluralities of external contact pads.

46. A memory module for use with a connector having a socket and a plurality of pins, the memory module comprising:
a substrate including a first surface, a second surface opposite the first surface, a first longitudinal side between the first and second surfaces, a second longitudinal side opposite the first longitudinal side and between the first and second surfaces, a first longitudinal edge at the interface of the first surface and the second longitudinal side, and a second longitudinal edge at the interface of the second surface and the second longitudinal side;
a microelectronic device carried by the substrate;
a plurality of first external contact pads arranged on the first surface; and
a plurality of second external contact pads arranged on the second surface, the individual first contact pads having a corresponding second contact pad that contacts an adjacent pin when the module is received in the socket, wherein one of the first contact pads is spaced apart from the first longitudinal edge by a first distance and the corresponding pad in the second contact pads is spaced apart from the second longitudinal edge by a second distance different than the first distance.

47. The memory module of claim 46 wherein the first longitudinal side defines a first plane and the second longitudinal side defines a second plane nonparallel with the first plane.

48. The memory module of claim 46 wherein the first longitudinal side defines a first plane and the second longitudinal side defines a second plane generally parallel to the first plane.

49. The memory module of claim 46 wherein the first contact pads have a first length and the second contact pads have a second length different than the first length.

50. A memory module for use with a connector having a socket and a plurality of pins, the memory module comprising: a substrate including a surface; a microelectronic device carried by the substrate; and means for electrically coupling the microelectronic device to the socket when the module is received in the socket, and for contacting corresponding pins of the socket at different times as the module is inserted generally perpendicularly into the socket to reduce the insertion force.

51. The memory module of claim 50 wherein the means for electrically coupling comprise a plurality of electrically conductive contact pads on the surface.

52. The memory module of claim 50 wherein:
the means for electrically coupling comprise a plurality of electrically conductive contact pads on the surface; and
the contact pads comprise a first contact pad with a first length and a second contact pad with a second length different than the first length.

53. The memory module of claim 50 wherein:
the surface is a first surface;
the substrate further comprises a second surface opposite the first surface; the means for electrically coupling comprise a first plurality of electrically conductive contact pads on the first surface; and
the substrate further comprises a second plurality of conductive contact pads on the second surface.

54. The memory module of claim 50 wherein:
the surface is a first surface;
the substrate further comprises a second surface opposite the first surface, a first longitudinal side between the first and second surfaces, and a second longitudinal side between the first and second surfaces and opposite the first longitudinal side; and
the first longitudinal side defines a first plane and the second longitudinal side defines a second plane nonparallel with the first plane.

55. The memory module of claim 50 wherein:
the surface is a first surface;
the substrate further comprises a second surface opposite the first surface, a first longitudinal side between the first and second surfaces, and a second longitudinal side between the first and second surfaces and opposite the first longitudinal side; and
the second longitudinal side is nonplanar.

56. The memory module of claim 50 wherein:
the surface includes a first longitudinal edge and a second longitudinal edge opposite the first longitudinal edge;
the means for electrically coupling comprise a plurality of electrically conductive contact pads on the surface;
the contact pads comprise a first contact pad with a first end proximate to the second longitudinal edge and a second contact pad with a second end proximate to the second longitudinal edge; and
the first end is spaced apart from the first longitudinal edge by a first distance and the second end is spaced apart from the first longitudinal edge by a second distance different than the first distance.

57. The memory module of claim 50 wherein:
the surface includes a first longitudinal edge and a second longitudinal edge opposite the first longitudinal edge;
the means for electrically coupling comprise a plurality of electrically conductive contact pads on the surface;
the contact pads comprise a first contact pad with a first end proximate to the second longitudinal edge and a second contact pad with a second end proximate to the second longitudinal edge; and
the first end is spaced apart from the first longitudinal edge by a first distance and the second end is spaced apart from the first longitudinal edge by a second distance at least approximately the same as the first distance.

58. The memory module of claim 50 wherein:
the substrate further comprises a plurality of spaced-apart teeth;
the means for electrically coupling comprise a plurality of electrically conductive contact pads on the surface; and
the external contact pads comprise a plurality of first contact pads partially on the teeth and a plurality of second contact pads between the first contact pads on adjacent teeth.

* * * * *